United States Patent
Callegari

(10) Patent No.: US 8,856,630 B2
(45) Date of Patent: Oct. 7, 2014

(54) CONTINUOUS PARALLEL VITERBI DECODER

(75) Inventor: Sergio Callegari, Milan (IT)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 392 days.

(21) Appl. No.: 12/995,211

(22) PCT Filed: Jun. 10, 2008

(86) PCT No.: PCT/EP2008/057203
§ 371 (c)(1),
(2), (4) Date: Nov. 30, 2010

(87) PCT Pub. No.: WO2009/149748
PCT Pub. Date: Dec. 17, 2009

(65) Prior Publication Data
US 2011/0083063 A1     Apr. 7, 2011

(51) Int. Cl.
*H03M 13/03* (2006.01)
*H03M 13/41* (2006.01)

(52) U.S. Cl.
CPC .......... *H03M 13/4169* (2013.01); *H03M 13/41* (2013.01)
USPC .......................................... 714/794; 714/795

(58) Field of Classification Search
CPC ........................... H03M 13/4169; H03M 13/41
USPC ................................................ 714/794, 795
See application file for complete search history.

(56) References Cited

U.S. PATENT DOCUMENTS

| | | | | |
|---|---|---|---|---|
| 5,010,554 A | * | 4/1991 | Bechtel et al. | 714/759 |
| 5,329,537 A | * | 7/1994 | Alard et al. | 714/794 |
| 5,355,376 A | * | 10/1994 | Cox et al. | 714/795 |
| 5,943,371 A | * | 8/1999 | Beale et al. | 375/341 |
| 6,005,898 A | * | 12/1999 | Kaewell, Jr. | 375/341 |
| 6,256,339 B1 | * | 7/2001 | Kaewell, Jr. | 375/147 |
| 6,404,828 B2 | * | 6/2002 | Kaewell, Jr. | 375/341 |
| 6,477,680 B2 | * | 11/2002 | Mujtaba | 714/795 |
| 6,577,672 B2 | * | 6/2003 | Kaewell, Jr. | 375/147 |
| 6,577,673 B2 | * | 6/2003 | Kaewell, Jr. | 375/147 |
| 6,601,215 B1 | * | 7/2003 | Thurnhofer | 714/795 |
| 6,690,750 B1 | * | 2/2004 | Hocevar et al. | 375/341 |
| 6,865,217 B2 | * | 3/2005 | Kaewell, Jr. | 375/147 |
| 6,901,118 B2 | * | 5/2005 | Hocevar et al. | 375/341 |
| 7,191,387 B1 | * | 3/2007 | Massoudi | 714/796 |
| 7,590,928 B2 | * | 9/2009 | Chiang | 714/795 |
| 7,607,073 B1 | * | 10/2009 | Cheong et al. | 714/795 |
| 7,751,507 B2 | * | 7/2010 | Son et al. | 375/341 |
| 7,793,200 B1 | * | 9/2010 | Parekh et al. | 714/792 |
| 2007/0230606 A1 | | 10/2007 | Anders et al. | |

OTHER PUBLICATIONS

Dawid, H. et al., "Viterbi Decoders: High Performance Algorithms and Architectures", Digital Signal Processing for Multimedia Systems, New York, NY, Marcel Dekker Inc., US, Jan. 1, 1999, pp. 417-459, XP002225706.

Moon, T., "Error Correction Coding", May 6, 2005, John Wiley & Sons, ISBN 0471648000, pp. 481, 484-485.

* cited by examiner

*Primary Examiner* — Joseph D Torres
(74) *Attorney, Agent, or Firm* — Rothwell, Figg, Ernst & Manbeck, P.C.

(57) ABSTRACT

A continuous parallel Viterbi decoder configured to (a) compute Trellis paths from an input bitstream encoded with a convolutional code, (b) backtrack the Trellis paths to generate an output signal, (c) store the Trellis paths in a shared memory, and (d) coordinate simultaneous read/write operations from and to the shared memory.

14 Claims, 4 Drawing Sheets

US 8,856,630 B2

CONTINUOUS PARALLEL VITERBI DECODER

CROSS-REFERENCE TO RELATED APPLICATION

This application is a 35 U.S.C. §371 National Phase Entry Application from PCT/EP2008/057203, filed Jun. 10, 2008, and designating the United States.

TECHNICAL FIELD

The present disclosure relates to methods and apparatuses for demodulation and channel coding and decoding and, particularly, this disclosure introduces a continuous parallel Viterbi decoder.

BACKGROUND

Decoders are used in a large range of communication applications for decoding a stream of data that has been encoded at the other end of the transmission channel.

Various kinds of decoders are known in the art. Viterbi decoders exploit the well know Viterbi algorithm to decode a bitstream that has been encoded through a convolutional code.

Convolutional codes are applicable in various areas and to various devices, including modems, amateur radio communications, satellite communications, computer repository devices and digital television broadcasting. In such cases, Viterbi decoders can be adopted to decode signal encoded according, for instance, through TCM (Trellis Code Modulation)

When TCM is used, an encoded sequence may be represented by a shortest path in a graph comprising a finite number of nodes and states. After an initial start-up of a Trellis, each node has two incoming paths and two outgoing paths.

A Viterbi arrangement in a decoder structures and simplifies a procedure for finding the path that has the shortest distance with respect to the input bit sequence that was received at the input terminal of the decoder.

More in detail, when considering the incoming paths of a node, only the path having the shortest distance is a possible candidate for inclusion in the finally selected path with the shortest distance to the input sequence for reassembling the original received bitstream, while all other incoming paths inevitably give rise to paths having longer distances.

Thus, on each step forward in the Trellis, the only incoming path retained at each node is the one selected having the shortest distance, while all remaining paths can be deleted from the decoder memory. At each subsequent step, the distance contribution from the next branch in the Trellis is added to that of the retained path, and the deletion procedure of non-relevant paths is repeated. The successive deletion of paths is backwardly executed, so that eventually only one distinct path, which is the same as the one which was used when the bitstream was encoded, will remain on successful completion of the decoding.

Even though Viterbi decoders have been largely used, the speed of current communication systems and amount of data that can be transferred today through communication channels require decoders with higher and higher performance, especially when dealing with continuous bitstreams.

For these reasons, attempts have been made in the prior art to improve Viterbi decoders when decoding a continuous stream of data composed of a plurality of coded blocks.

One known implementation, shown in FIG. 1, involves duplicating a Viterbi decoder. Two consecutively coded blocks are sent alternatively to the inputs of two identical decoders. After independent processing, the decoded data are joined in a new sequence.

Another known implementation, shown in FIG. 2, involves overclocking the Viterbi decoder. Two consecutively coded blocks are stored in a buffer and sent in sequence to the inputs of the Viterbi decoders, which must operate at least at double speed compared with the bitstream speed.

However, both solutions have shown drawbacks: the first solution uses two times the occupation area normally needed by a conventional Viterbi decoder, thus increasing the cost of hardware support; the second solution suffers from both high power consumption and high occupation area.

SUMMARY

The aim of the present invention is to provide a Viterbi decoder that overcomes the above drawbacks.

Within this aim, an object of the present invention is to disclose a Viterbi decoder supporting high speed decoding without increasing manufacturing costs, as it is the case when two parallel decoders are used.

Another object of the invention is to disclose a Viterbi decoder is to support high speed decoding without recurring to overclocking, so as to maintain power consumption at usual levels.

This aim and other objects which will become better apparent hereinafter are achieved by a continuous parallel Viterbi decoder comprising input means for computing Trellis paths from an input bitstream encoded with a convolutional code and output means for backtracking the Trellis paths to generate an output signal; a shared memory for storing the Trellis paths; and coordination means for coordinating simultaneous read/write operations on the shared memory.

In another aspect of the invention, a method for decoding a bitstream using a continuous parallel Viterbi decoder comprises the steps of: computing Trellis paths from a decoder input bitstream encoded with a convolutional code; backtracking said Trellis paths for generating an output signal; storing the Trellis paths in a shared memory; and coordinating simultaneous read/write operations to and from the shared memory.

BRIEF DESCRIPTION OF THE DRAWINGS

Further characteristics and advantages of the invention will become better apparent from the detailed description of particular but not exclusive embodiments, illustrated by way of non-limiting examples in the accompanying drawings, wherein.

DETAILED DESCRIPTION

Figure 1:
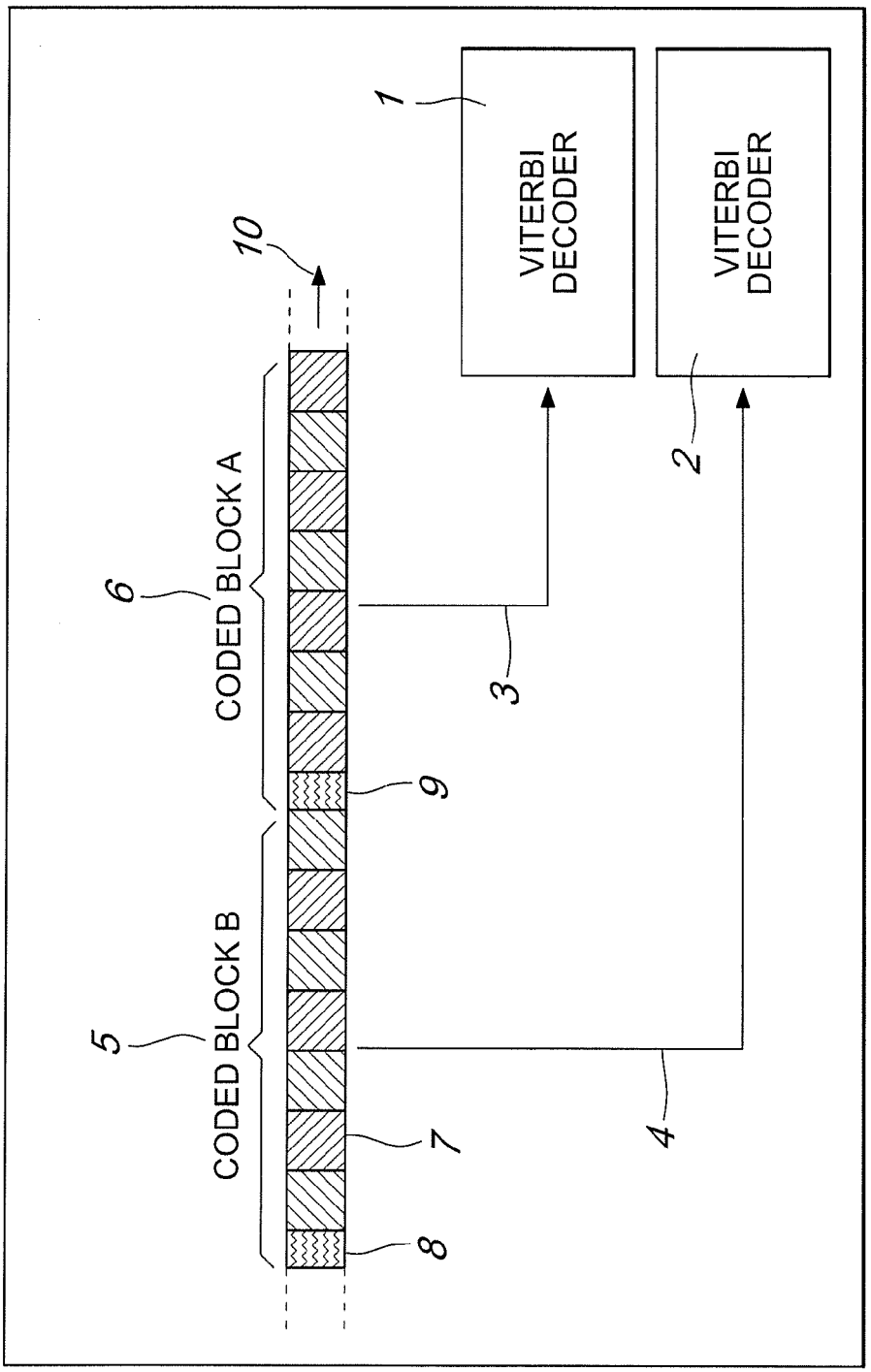
FIG. 1 shows a known arrangement for continuous data decoding using Viterbi Decoders.
Figure 2:
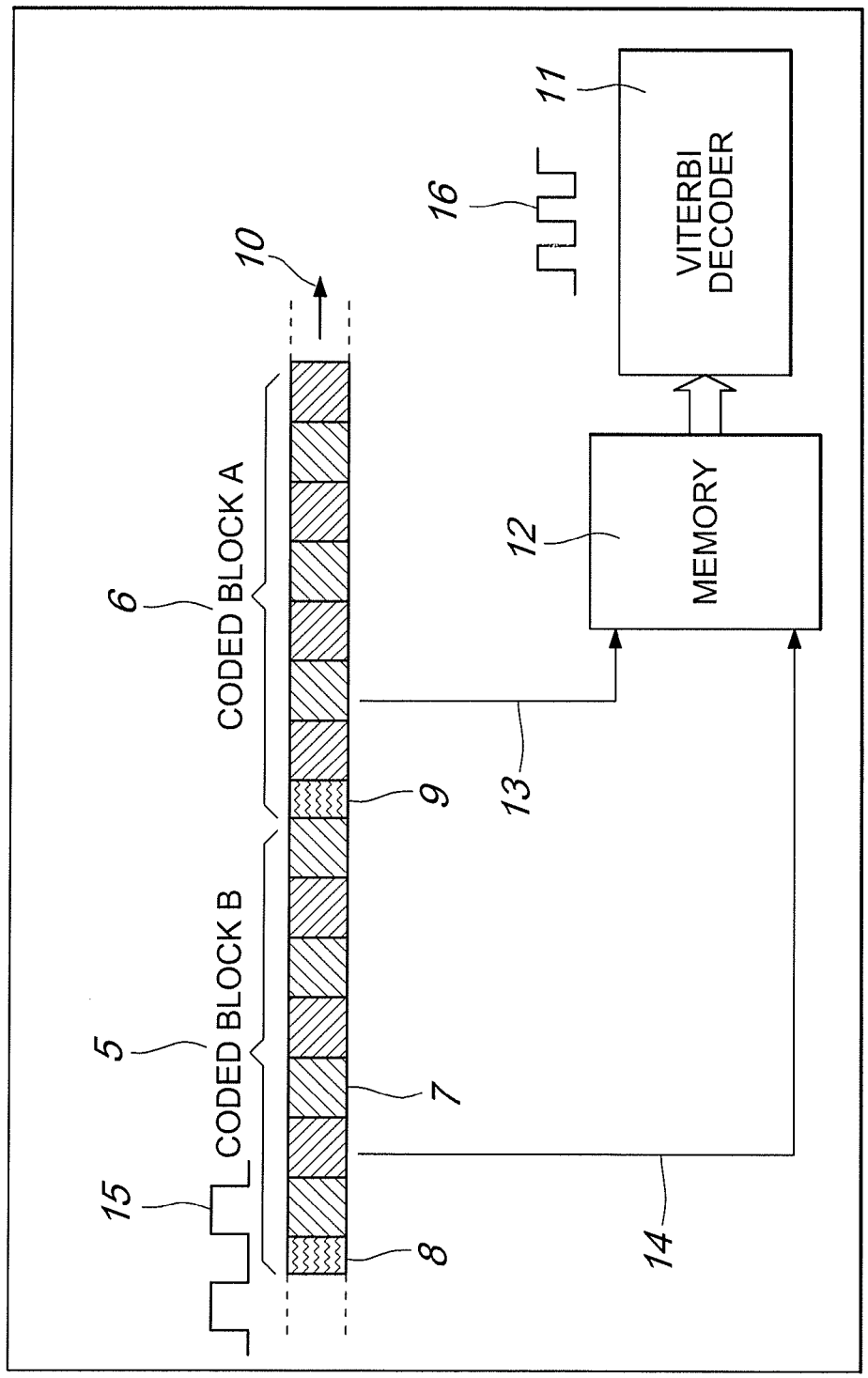
FIG. 2 shows a different known arrangement for continuous data decoding using a Viterbi Decoder.

In order to better understand the invention, FIGS. 1 and 2, which show prior art implementations of Viterbi decoders, are first discussed.

FIG. 1 shows two identical Viterbi decoders 1 and 2, whereby two consecutively encoded blocks 5 and 6 are sent to the inputs 3 and 4 of each of the two Viterbi decoders.

Viterbi decoders 1 and 2 independently process each block of data received at their respective input terminals. The bitstream is transported in the direction illustrated by arrow 10. The blocks of data 5 and 6 are constituted by segments 7, which length is the traceback length of the decodification Trellis in the Viterbi decoder. The bitstream further comprises last segments 8, 9 in each block of data. Last segments 8, 9 have lengths that can be shorter than the traceback length. When the independent decoding of each block is finished, the decoded data is combined into a new sequence.

FIG. 2 shows a memory module 12, which can store two coded blocks 5 and 6. The standard segments 7 are fed via the connections 13 and 14 to the respective inputs of memory module 12.

The blocks are then stored in the memory module 12 and transported as a single stream to the input of Viterbi decoder 11. In order to keep the stored data in the memory 12 and to synchronize the output of Viterbi decoder 11, the Viterbi decoder needs to be clocked with a speed 16 that is two times the speed of the data stream transported in the direction 10, which is clocked at half of the clock rate 15 of the Viterbi decoder 11.

Figure 3:
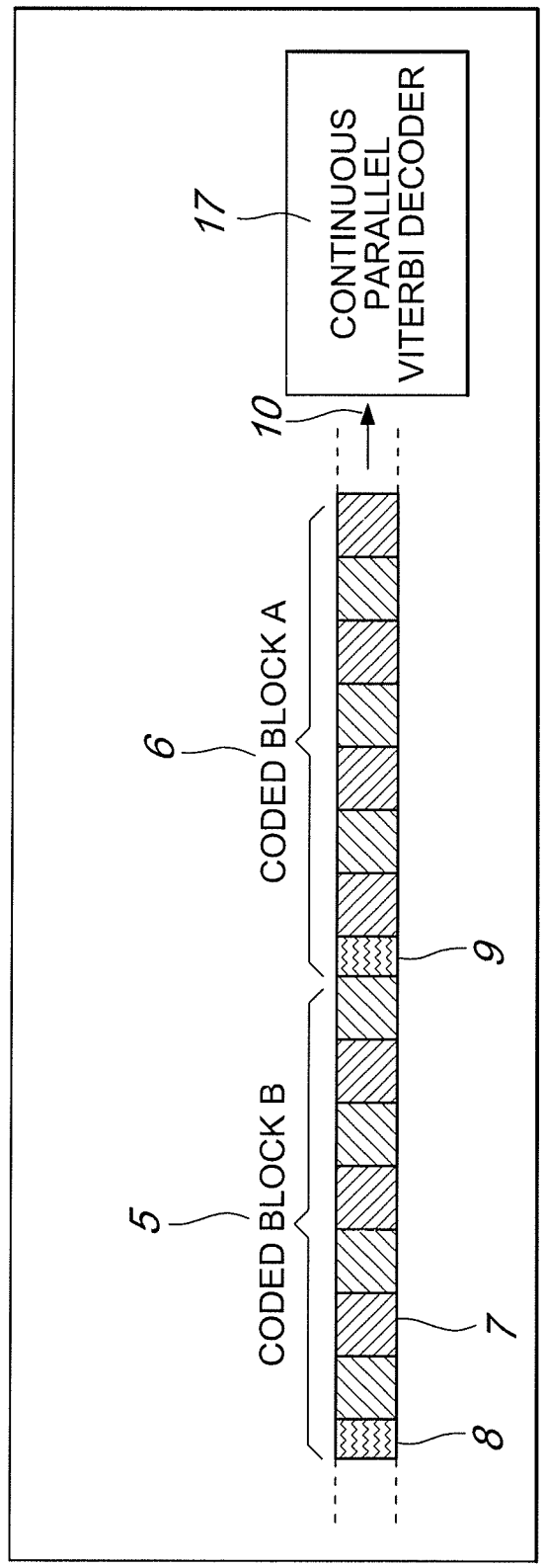
FIG. 3 shows a data decoding arrangement according to the present invention.

FIG. 3 shows a high-level overview of the arrangement using a Continuous Parallel Viterbi Decoder (CPVD) 17 according to the invention, for an incoming bitstream that consists of a plurality of blocks.

The plurality of blocks is shown in FIG. 3 as a snapshot for two blocks of a continuous bitstream, i.e. first coded block A 6 and second coded block B 5.

Each block comprises a plurality of segments 7 of two types: segments 7 containing data encoded according to a convolutional code which may be equal to the length of the traceback length and segments 8, 9 whose length is less than the traceback length.

Figure 4:
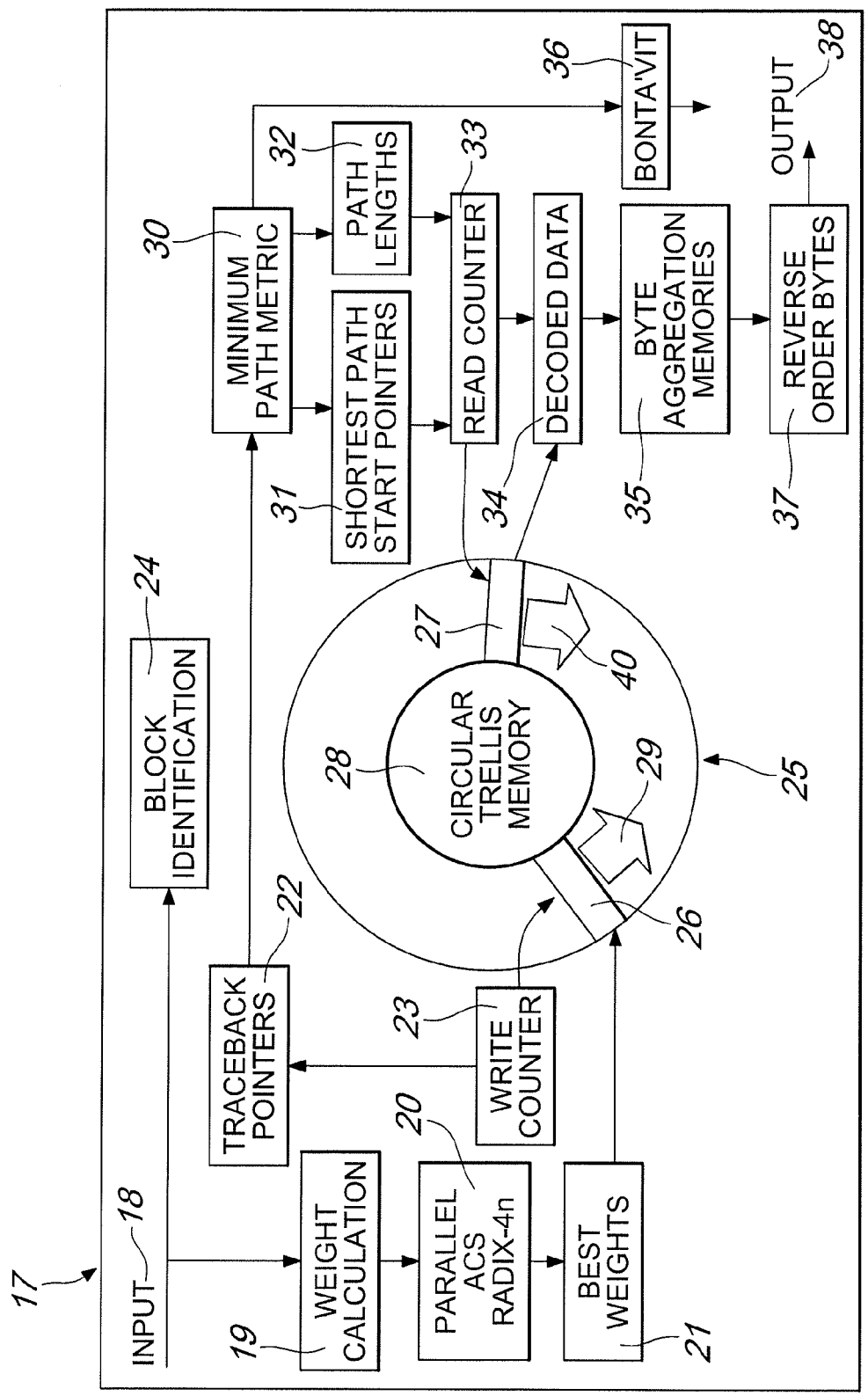
FIG. 4 shows a component diagram of the data decoding arrangement according to the present invention.

FIG. 4 is a schematic representation of the CPVD 17. The CPVD 17 comprises an input 18 for an encoded bitstream. The bitstream reaches input 18 and is fed in parallel to a block identification module 24 and to a Weight Calculation module 19.

The bitstream comprises groups of bits and may include signalling bits. Bits may be either conventional bits, hereby referred to as hard-bits, or soft-bits. Calculation of the distance of hard-bits may be performed through Hamming distance, as known in the art. Calculation of the distance of soft-bits may be performed through Euclidean distance, as known in the art. Groups of bits may have the size of 4×n hard bits/soft bits, preferably with n=1, 2, 3, 4. However, higher values of n may be foreseen.

The block identification module 24 is configured to evaluate a specific pattern in the bitstream and to identity if a new code block has arrived at input 18. Weight Calculation module 19 computes branch metrics from the input bitstream, which is encoded using a convolutional code, The branch metrics are hereby computed in parallel, i.e. a group of 4×n hard-bits or soft-bits is provided at each computing cycle.

The output of the Weight Calculation module 19 is fed to a parallel ACS (Add-Compare-Select) Radix-4n module 20. The ACS module 20 outputs a shortest distance of a received bit sequence based on the values received from the Weight Calculation module 19.

The parallel ACS module 20 accesses the shared memory according to the Write Counter module 23. Write Counter module 23 stores an initial position of a Trellis path of a previous Trellis element while a new path metric outputted from the parallel ACS module 20 is stored in a Best Weights module 21, which stores this value as a vector.

Best Weights vector 21 points to a location 26 addressed by the Write Counter 23 position in a shared memory 28. Shared memory 28 preferably is a Circular Trellis Memory, which in write direction, symbolised by directional arrow 29, stores a new value at each clock cycle.

Write Counter 23 is incremented at each clock cycle until the end of a segment is reached.

An end of a segment is identified either when the traceback length is equal to the segment length, which is tracked by incrementing the Traceback Pointers module 22, or by the detection of a new block identification signal.

A minimum path metric module 30 is provided for evaluation of the Best Weights vector 21 for determining data related to a shortest Trellis path, a start pointer value and a path length value.

This data is stored in the Shortest Path Start Pointers module 31 and in parallel stored in the Path Lengths module 32.

The values stored in the Shortest Path Start Pointers module 31, together with the value stored in the Path Lengths module 32 affect the Read Counter module 33, which is backtracking the Trellis paths stored in the Circular Trellis Memory 28.

Read Counter 33 accesses shared memory 28 based on the input from the Shortest Path Start Pointers 31 together with the Path Lengths 32. Read Counter 33 reads the best paths of the segments out of the Circular Trellis Memory 28 from exemplary shown storage location 27. The directional arrow 40 indicates that the read-out process is in the opposite direction of the write process.

The decoded data is then stored in Decoded Data module 34. Write Counter 23 and Read Counter 33 coordinate simultaneous read and write operations on the shared memory module 28.

The output of Decoded Data module 34 is fed to Byte Aggregation Memories 35, which progressively store the output until a complete byte is stored.

Reverse Order Bytes module 37 is configured to output the byte sequence in a reverse order at the output 38 of the decoder. In addition a module 36, hereby referred to as BontàVit module, is configured to output at the output 38 a value that corresponds to the trust level of the decoded data.

The functioning of the present invention will now be described with reference to FIGS. 3 and 4.

A bitstream of data, represented in FIG. 3 by two blocks of data 5 and 6, is received at the input of Continuous Parallel Viterbi Decoder 17 according to the invention.

The blocks of data 5 and 6 may comprise standard segments 7, having the same length as the traceback length of the decodification Trellis in the decoder, and last segments 8 and 9 having lengths which can be less than the traceback length.

The encoding of each block involves that the convolutional coder is resetted at the start of each block, i.e. the Trellis diagram is restarted. In order to decode the stream of data in parallel and continuous mode, CPVD 17 processes the input data sequence in segments that can have a maximum length up to the traceback length of the decodification Trellis.

The inputs of the CPVD 17 structure are groups of bits of the incoming coded data stream. The bitstream is either composed of hard bits, by which term it is herein intended "normal" bits, or soft bits. The groups of data may have the size 4×n hard bits/soft bits, where n is an integer preferring having values of 1, 2, 3 or 4. In this case, the maximum group size would be 16-bit. However, larger sizes can be obtained by using n>4.

The blocks of data may include signals for their identification. Block identification signals are activated if the bits and/or soft bits belong to a specific block, otherwise, if all block identification signals are disabled, the CPVD 17 does not process the data at the input. In the case that all block identification signals are disabled, CPVD 17 continues with processing the previously received data.

Exemplary internal functional modules of the CVDP 17 are depicted in FIG. 4, which shows an input terminal 18 for receiving the incoming coded data stream. At every clock tick, the CPVD fetches data from input 18.

Such data is first evaluated first by the block identification module 24 to determine to which block it belongs, then the data is processed in Weight Calculation module 19. Weight Calculation module 19 calculates the distances between the current and the previous state in the Trellis of the 4×n input hard bits or soft bits in parallel. The distances may either be a Hamming distance for a hardbit calculation, or a weighted distance for a soft bit calculation.

Using an Add-Compare-Select ACS parallel module, which in the preferred embodiment may be a parallel ACS radix-4n module 20, the calculated distances received from Weight Calculation module 19 are summed to the previous accumulated path metric for every node of that particular instance, or, for every state of the Trellis diagram in one time.

The ACS module may be a radix-4, radix-8, radix-12 or a radix-16 module, depending on the value of the integer n of the input hard bit/soft bit group. Using the Viterbi algorithm, only one single inward path is saved for each node. This path has the shortest distance to the detected sequence.

In case the paths have the same distance, e.g. a hamming distance, one of the paths will be eliminated arbitrarily. A pointer to a previous element of the Trellis is then saved in the Circular Trellis Memory 28 in the position pointed to by Write Counter 23.

The newly accumulated path metric is saved in now the Best Weights module 21. Subsequently, Write Counter 23 is increased. At the end of a segment, which ends when its length is equal to the traceback length in the Trellis or when the beginning of a new block begins, the Best Weights vector is evaluated to determine the smallest weight, which is identified by Minimum Path Metric 30 module.

Minimum Path Metric module 30 stores a value that indicates the shortest Trellis path. After the shortest Trellis path has been identified, the Best Weight vector 21 is reset, for instance with a null weight value.

In addition, the specific metric, i.e. the total weight of the best path of the block is updated with a new value resulted from Best Weights 21 evaluation and a previously stored block value comparison.

This value stored in the Minimum Path Metric module 30 is stored and linked to the best path of the segment together with the length of the segment. The values for the shortest path are stored in the Shortest Path Start Pointers 31 module and the path length value is stored in the Path Lengths module 32.

The input identification signals are evaluated by Block Identification module 24. Such evaluation gives rise to three different possibilities: the hard bit/soft bit group belongs to a new block; the hard bit/soft bit group belongs to the previous block, whose path metric is already stored; the hard bit/soft bit group does not belong to any block and is invalid.

In the first case, the Best Weights 21 vector is initialized, the pointer to the best path is set to zero in the traceback pointer 22 module and the metric 30 is reset to a minimum value, for instance to zero.

In all three cases the block identifier is stored and is linked to the best path of that segment.

The best paths of the segments previously stored in the circular Trellis memory are read in reverse mode, i.e. from the last data stored to the first data stored. While reading the path and by using the state transitions of two pointers in the Trellis path, the input segment is decoded.

The size of the decoded data depends on the original size of the inputted hard bit/soft bit group. For a coding rate of R=1/2 and n=1, the size of the input group is four bits/soft bits and the size of decoded data is 2 bits. For n=2 the input group is eight bits/soft bits and the size of decoded data is four bits. For n=3 the input group is twelve hard bits/soft bits and the size of decoded data is six bits. For n=4 the input group is sixteen hard bits/soft bits and the size of decoded data is eight bits, which equals to a byte.

Decoded Data module 34 stores the decoded bits, which are joined with other previous decoded bits of the same segment until they form a byte. This byte is stored in Byte Aggregation Memories module 35. Byte Aggregation Memories module 35 stores the bytes in reverse order with respect to the incoming data sequence.

In order to reassemble the original data, the completed bytes stored in Byte Aggregation Memories module 35 are read in reverse order from Reverse Order Bytes module 37, starting from the last stored byte for a segment and then transported to the output 38 as decoded bytes, together with a valid identification signal and BontàVit value 36.

BontàVit value 36 is a value proportional to the worst minimum path metric 30 of the segments of a block and represents the trust level on the decoded data.

It has been shown that the invention fully achieves the intended aim and objects, since it provides a decoding circuit and a decoding method which provides a fast, reliable, cost effective solution for a decoding circuit. The invention advantageously allows for parallel processing of the incoming bitstream without doubling the frequency of the encoder, reducing the area consumed when manufactured, and minimizes the power consumption and heat dissipation.

Minimal space is required and a very low power consumption and heat dissipation is obtained. This advantageously makes the invention applicable to a wide range of devices, e.g. cell phones, in particular when space is limited, low power circuits are needed and minimum heat dissipation is to be achieved. It further does limit the influence on neighboring circuits, since the circuit operates at the same clock rate as the data stream. No additional clock generator is needed or desired, since applying a higher clock rate would result in higher electromagnetic radiation.

Clearly, several modifications will be apparent to and can be readily made by the skilled in the art without departing from the scope of the present invention.

Therefore, the scope of the claims shall not be limited by the illustrations or the preferred embodiments given in the description in the form of examples, but rather the claims shall encompass all of the features of patentable novelty that reside in the present invention, including all the features that would be treated as equivalents by the skilled in the art.

Where technical features mentioned in any claim are followed by reference signs, those reference signs have been included for the sole purpose of increasing the intelligibility of the claims and accordingly, such reference signs do not have any limiting effect on the interpretation of each element identified by way of example by such reference signs.

The invention claimed is:

1. A continuous parallel Viterbi decoder, the decoder being configured to:

receive an input bitstream encoded with a convolutional code, said input bitstream comprising a plurality of blocks and a block identification signal corresponding to each block;
identify each of said received blocks using said corresponding block identification signal;
compute Trellis paths for each of said identified blocks;
backtrack said Trellis paths to generate an output signal;
store in a shared memory said Trellis paths;
coordinate simultaneous read/write operations from and to said shared memory, said write operation for storing in said shared memory an initial position of a Trellis path of a previous Trellis element, said read operation for reading the best paths of said identified blocks out of the shared memory; and
link each of said block identification signals to said best path of its said corresponding identified block.

2. The continuous parallel Viterbi decoder according to claim 1, wherein said shared memory is a circular memory.

3. The continuous parallel Viterbi decoder according to claim 1, wherein said decoder includes a write counter and a read counter for coordinating the simultaneous read/write operations.

4. The continuous parallel Viterbi decoder according to claim 3, wherein said decoder is configured to access said shared memory according to said read counter.

5. The continuous parallel Viterbi decoder according to claim 1, wherein said bitstream is composed of hard bits.

6. The continuous parallel Viterbi decoder according to claim 1, wherein said bitstream is composed of soft bits.

7. The continuous parallel Viterbi decoder according to claim 1, wherein said decoder comprises a Weight Calculation module for computing branch metrics and a parallel Add-Compare-Select ACS module accessing said shared memory according to said write counter.

8. A method for decoding a bitstream using a continuous parallel Viterbi decoder comprising the steps of:
receiving an input bitstream encoded with a convolutional code, said input bitstream comprising a plurality of blocks and a block identification signal corresponding to each block;
identifying each of said received blocks using said corresponding block identification signal;
computing Trellis paths for each of said identified blocks;
backtracking said Trellis paths to generate an output signal;
storing said Trellis paths in a shared memory;
coordinating simultaneous read/write operations from and to the shared memory, said write operation for storing in said shared memory an initial position of a Trellis path of a previous Trellis element, said read operation for reading the best paths of said identified blocks out of the shared memory, and
linking each of said block identification signals to said best path of its said corresponding identified block.

9. The method according to claim 8, wherein said shared memory is a circular memory.

10. The method according to claim 8, wherein said simultaneous read/write operations are coordinated by a write counter and a read counter.

11. The method according to claim 10, wherein the output signal is generated by accessing said shared memory according to said read counter.

12. The method according to claim 8, wherein said bitstream is composed of hard bits.

13. The method according to claim 8, wherein said bitstream is composed of soft bits.

14. The method according to claim 8, wherein said input bitstream is processed by a Weight Calculation module for computing branch metrics and a parallel Add-Compare-Select ACS module accessing said shared memory according to said write counter.

* * * * *

UNITED STATES PATENT AND TRADEMARK OFFICE
CERTIFICATE OF CORRECTION

PATENT NO. : 8,856,630 B2
APPLICATION NO. : 12/995211
DATED : October 7, 2014
INVENTOR(S) : Callegari It is certified that error appears in the above-identified patent and that said Letters Patent is hereby corrected as shown below:

Specification

In Column 5, Line 8, delete "CVPD" and insert -- CPVD --, therefor.

In Column 5, Lines 35-36, delete "Trellis...... Counter 23." and insert the same at Line 34, after "of the", as a continuation paragraph.

Signed and Sealed this
Second Day of August, 2016

Michelle K. Lee
*Director of the United States Patent and Trademark Office*